United States Patent
Manceau et al.

(10) Patent No.: US 10,174,216 B2
(45) Date of Patent: Jan. 8, 2019

(54) INK FOR FORMING P LAYERS IN ORGANIC ELECTRONIC DEVICES

(71) Applicant: Commissariat A L'Energie Atomique Et Aux Energies Alternatives, Paris (FR)

(72) Inventors: Matthieu Manceau, Annecy (FR); Solenn Berson, Chambéry (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/039,158

(22) PCT Filed: Nov. 25, 2014

(86) PCT No.: PCT/IB2014/066313
§ 371 (c)(1),
(2) Date: May 25, 2016

(87) PCT Pub. No.: WO2015/079378
PCT Pub. Date: Jun. 4, 2015

(65) Prior Publication Data
US 2017/0137645 A1    May 18, 2017

(30) Foreign Application Priority Data

Nov. 26, 2013  (FR) ..................... 13 61621

(51) Int. Cl.
| | |
|---|---|
| *H01B 1/12* | (2006.01) |
| *C09D 11/106* | (2014.01) |
| *C09D 11/52* | (2014.01) |
| *H01L 51/00* | (2006.01) |
| *C09D 11/037* | (2014.01) |
| *C09D 11/10* | (2014.01) |
| *C09D 11/03* | (2014.01) |
| *C09D 11/30* | (2014.01) |
| *H01L 51/42* | (2006.01) |
| *H01L 51/50* | (2006.01) |
| *H01L 21/02* | (2006.01) |

(52) U.S. Cl.
CPC ............ *C09D 11/106* (2013.01); *C09D 11/03* (2013.01); *C09D 11/037* (2013.01); *C09D 11/10* (2013.01); *C09D 11/30* (2013.01); *C09D 11/52* (2013.01); *H01B 1/122* (2013.01); *H01L 51/0004* (2013.01); *H01L 51/004* (2013.01); *H01L 51/0007* (2013.01); *H01L 51/0043* (2013.01); *H01L 51/0047* (2013.01); *H01L 51/422* (2013.01); *H01L 51/502* (2013.01); *H01L 21/02565* (2013.01); *H01L 21/02601* (2013.01); *H01L 21/02628* (2013.01); *H01L 51/4293* (2013.01); *H01L 2251/303* (2013.01); *Y02E 10/549* (2013.01)

(58) Field of Classification Search
CPC ........... H01L 2251/303; H01L 51/0004; H01L 51/0007; H01L 51/004; H01L 51/0043; H01L 51/0047; H01L 51/422; H01L 51/502; H01L 51/4293; H01L 21/02628; H01L 21/02565; H01L 21/02601; C09D 11/106; C09D 11/03; C09D 11/30; C09D 11/037; C09D 11/10; C09D 11/52; Y02E 10/549; H01B 1/122
See application file for complete search history.

(56) References Cited

U.S. PATENT DOCUMENTS

| | | |
|---|---|---|
| 2009/0061276 A1 | 3/2009 | Tamura et al. |
| 2015/0171355 A1* | 6/2015 | Fukui .................. H01L 51/4226 136/263 |

FOREIGN PATENT DOCUMENTS

| | | | |
|---|---|---|---|
| EP | 0962943 | A1 | 12/1999 |
| EP | 2631008 | A1 | 8/2003 |
| JP | 2003331869 | A | 11/2003 |
| JP | 2004095263 | A | 3/2004 |
| WO | 2004094501 | A2 | 11/2004 |
| WO | 2004094501 | A3 | 11/2004 |
| WO | 2007094019 | A1 | 8/2007 |
| WO | 2009018009 | A1 | 2/2009 |
| WO | WO 2014017535 | * | 1/2014 ............ H01M 14/00 |

OTHER PUBLICATIONS

Jens Meyer et al: "Transition Metal Oxides for Organic Electronics: Energetics, Device Physics and Applications", Advanced Materials, vol. 24, No. 40, Oct. 23, 2012, pp. 5408-5427.
Gérard Perrier et al: "Impedance Spectrometry of Optimized Standard and Inverted P3HT-PCBM Organic Solar Cell", Solar Energy Materials & Solar Cells, Elsevier, 101, (2012) p. 210-216.
International Search Report for PCT/IB2014/066313 dated Feb. 25, 2015.

* cited by examiner

Primary Examiner — Mark Kopec
Assistant Examiner — Jaison P Thomas
(74) Attorney, Agent, or Firm — Cooper Legal Group, LLC; Ronald M. Kachmarik

(57) ABSTRACT

An ink that can form a P-type layer in an organic electronic device. The ink includes at least nanoparticles of P-type semiconductor metal oxide(s) selected from among $V_2O_5$, NiO, $MoO_3$, $WO_3$ and mixtures thereof and an ionomer, the ionomer being a perfluorosulfonate copolymer, the mass ratio between the ionomer and the nanoparticles of P-type semiconductor metal oxide(s) selected from among $V_2O_5$, NiO, $MoO_3$, $WO_3$ and mixtures thereof being between 0.005 and 0.115. Also, a P layer of an organic electronic device, an electronic device and the formation method thereof.

15 Claims, No Drawings

INK FOR FORMING P LAYERS IN ORGANIC ELECTRONIC DEVICES

The present invention relates to the field of organic electronic devices such as organic photovoltaic cells, organic light-emitting diodes (OLEDs) and organic photodetectors (OPDs).

These devices consist of a first and a second electrode, respectively positioned above and below a stack of several layers especially comprising an "active" layer adjoining a "p-type" layer and an "n-type" layer.

The invention aims to propose a p-type layer that is improved and as such advantageous for obtaining organic electronic devices, of which the stability, especially thermal stability and air stability, is improved and which has a high performance.

Organic electronic devices, and in particular organic photovoltaic cells, are generally classified according to the structure of their architecture: standard or inverted.

In a standard structure, the layers are deposited in the following order:
 a substrate;
 conductive layer as first electrode (anode);
 p-type semiconductor layer referred to as "hole transport layer";
 electrically active layer;
 n-type semiconductor layer referred to as "electron transport layer"; and
 conductive layer as second electrode (cathode).

In an inverted structure, the stack is reversed and the layers are positioned in the following sequence:
 a substrate;
 conductive layer as first electrode (cathode);
 an n-type semiconductor layer referred to as "electron transport layer";
 an electrically active layer;
 a p-type semiconductor layer referred to as "hole transport layer";
 second electrode (anode) or upper electrode.

Generally, the p-type semiconductor layers, considered in these structures, are formed for the most part from a mixture of two polymers, poly(3,4-ethylenedioxythiophene) (PEDOT) and sodium polystyrene sulfonate (PSS) referred to as PEDOT:PSS. As such, these layers have the property of being hydrophilic.

This material has many advantages in terms of conductivity, transparency and stability, especially photochemical stability and oxidation stability.

Furthermore, the electrically active layers conventionally considered in these structures consist of a mixture containing at least two semiconductor materials: an electron acceptor, n-type material and an electron donor (hole transporter), p-type material. These active layers are therefore generally hydrophobic.

There is therefore naturally an incompatibility between these two types of layers. This lack of affinity furthermore has the consequence of making the stack thereof difficult to produce.

Furthermore, the fact that this PEDOT:PSS material is obtained from a complex formulation of two polymers and several solvents and additives is not very favorable to adjustments. Indeed it is tricky to intervene in the formulation without fear of destabilizing it.

P-type semiconductor metal oxides, such as for example $V_2O_5$, NiO, $MoO_3$ and $WO_3$, in the form of nanoparticles, may constitute an alternative to the use of PEDOT:PSS. These metal oxides are also generally very transparent, and may have a good wettability and also a strong adhesion to the active layer. In addition, their reduced conductivity may be completely compensated for by reducing the thickness of the final layer.

Thus, the use of $WO_3$ makes it possible to achieve a very high initial performance. Unfortunately, it has two major drawbacks: a very rapid degradation in air including in the absence of light, and a mediocre thermal stability. In both cases, this leads to an abrupt drop in the performance of the device which uses $WO_3$ particles as components of the p-layer.

Consequently, there remains a need for a solution for obtaining a p-type layer that is particularly stable, especially with respect to air, heat and moisture.

The objective of the present invention is specifically to meet this need.

One objective of the invention is to propose an improved solution for producing a p-layer and more generally for producing organic electronic devices and consequently modules that are improved in terms of stability, performance and service life.

Another objective of the invention is to propose a process for preparing an organic electronic device, in which the use of the p-type layer is facilitated, especially relative to that of p-type layers made of PEDOT:PSS.

Thus, the main subject of the present invention is an ink, suitable for forming a p-type layer in an organic electronic device, characterized in that it comprises at least some nanoparticles of p-type semiconductor metal oxide(s) selected from $V_2O_5$, NiO, $MoO_3$, $WO_3$ and mixtures thereof and an ionomer, said ionomer being a perfluorosulfonated copolymer, the weight ratio between the ionomer and the nanoparticles of p-type semiconductor metal oxide(s) being between 0.005 and 0.115.

Preferably, the weight ratio between the ionomer and the nanoparticles of p-type semiconductor metal oxide(s) is between 0.01 and 0.055.

Advantageously, the nanoparticles of p-type semiconductor metal oxide(s) are formed completely or partly of $WO_3$.

According to another of its aspects, the present invention relates to a p-type layer of an organic electronic device, characterized in that it comprises at least some nanoparticles of p-type semiconductor metal oxide(s) selected from $V_2O_5$, NiO, $MoO_3$, $WO_3$ and mixtures thereof and an ionomer which is a perfluorosulfonated copolymer, the weight ratio between the ionomer and the nanoparticles of p-type semiconductor metal oxide(s) being between 0.005 and 0.115.

According to yet another of its aspects, the present invention targets an organic electronic device comprising a p-type layer as defined above.

According to yet another of its aspects, the present invention relates to the use of $WO_3$ nanoparticles for forming a p-type layer in an organic electronic device, characterized in that said nanoparticles are formulated with at least one ionomer, preferably said ionomer being a perfluorosulfonated copolymer, in said p-type layer in an ionomer/$WO_3$ nanoparticles weight ratio of between 0.005 and 0.115.

Quite unexpectedly, the inventors have thus observed that the use, during the fabrication of an organic electronic device, of nanoparticles of p-type semiconductor metal oxide(s) such as $WO_3$ in a form combined with an ionomer proves particularly advantageous. Such a combination specifically makes it possible to obtain a p-type layer that displays properties in terms of thermal stability and air stability that are significantly improved in comparison with a p-type layer formed from the same $WO_3$ nanoparticles but in a form not combined with an ionomer. These advantages are more particularly illustrated in the examples described below.

Moreover, the other expected properties, namely uniformity and homogeneity of the p-layer on the active layer, and performance in OPV cells, additionally prove not be impaired by such a combination.

The organic electronic device according to the invention may be an organic photovoltaic cell, an organic light-emitting diode (OLED) or an organic photodetector (OPD), in standard structure or inverted (NIP) structure.

Other advantages and features will become apparent on reading the description and examples that follow.

DETAILED DESCRIPTION

As already mentioned, the ink according to the invention comprises at least some nanoparticles of p-type semiconductor metal oxide(s) and an ionomer.

The weight ratio between the ionomer and the nanoparticles of p-type semiconductor metal oxide(s) is between 0.005 and 0.115.

Preferably, the weight ratio between the ionomer and the nanoparticles of p-type semiconductor metal oxide(s) is between 0.01 and 0.055.

The nanoparticles of p-type semiconductor metal oxide(s) are advantageously selected from the following metal oxides: $V_2O_5$, NiO, $MoO_3$, $WO_3$ and mixtures thereof.

Preferably, the nanoparticles of p-type semiconductor metal oxide(s) are formed completely or partly of $WO_3$.

They have a size advantageously of between 2 nm and 200 nm. The term "size" is preferably understood to mean the largest dimension of the particles.

According to one particular embodiment, the nanoparticles of p-type semiconductor metal oxide(s) may be in the form of hydrates.

Preferably, the amount of nanoparticles of p-type semiconductor metal oxide(s) varies from 90% to 99.5%, preferably from 95% to 99% by weight, relative to the total weight of the nanoparticles of p-type semiconductor metal oxide(s) and of ionomer(s).

Within the meaning of the present invention, the term "ionomer" is understood to mean a synthetic polymer, homopolymer or copolymer, comprising ionic groups or ionizable groups like carboxylate, sulfonate or phosphonate functions. It may also be referred to as an "ionic polymer".

The ionomer used according to the invention is not an electrically conductive polymer.

The ionomer used according to the invention is advantageously a perfluorosulfonated copolymer, and in particular a sulfonated tetrafluoroethylene copolymer.

More preferably, the ionomer is a copolymer having a tetrafluoroethylene backbone comprising perfluorovinyl ether groups and the terminal ends of which are functionalized by sulfonate groups or sulfonic acid functions.

Advantageously, the ionomer used according to the invention is Nafion® sold by Dupont.

Preferably, the amount of ionomer(s) varies from 0.5% to 10%, preferably from 1% to 5% by weight, relative to the total weight of the nanoparticles of p-type semiconductor metal oxide(s) and of ionomer(s).

In particular, an ink according to the invention may comprise from 0.5% to 20% by weight of solids relative to the total weight of the ink.

The term "solids" is understood to mean the constituents of the ink with the exception of the solvent, that is to say essentially the nanoparticles of p-type semiconductor metal oxide(s) and the ionomer.

An ink according to the invention may additionally comprise an alcoholic solvent, in particular a lower alcohol, preferably a $C_2$-$C_4$ lower monoalcohol, and in particular ethanol, n-propanol, isopropanol, n-butanol, 2-butanol or methylpropanol.

In particular, an ink according to the invention may comprise from 80% to 99.5% by weight of alcoholic solvent relative to the total weight of the ink.

The ink is generally formulated without surfactant.

During the formulation of the ink, after mixing the nanoparticles of p-type semiconductor metal oxide(s) and the ionomer, several post-treatments may be carried out such as treatments suitable for homogenizing the mixture or for settling the secondary particles. More specifically, these treatments may consist of a stirring or a centrifugation.

According to one particular embodiment, the ink according to the invention consists of an organic solvent, of at least some nanoparticles of p-type semiconductor metal oxide(s) selected from $V_2O_5$, NiO, $MoO_3$, $WO_3$ and mixtures thereof and of at least one ionomer which is a perfluorosulfonated copolymer, the weight ratio between the ionomer and the nanoparticles of p-type semiconductor metal oxide(s) selected from $V_2O_5$, NiO, $MoO_3$, $WO_3$ and mixtures thereof being between 0.005 and 0.115.

As specified above, the ink thus formed is useful for constituting the p-layer of an organic electronic device.

Thus, according to another of its aspects, the present invention relates to a p-type layer of an organic electronic device, characterized in that it comprises at least some nanoparticles of p-type semiconductor metal oxide(s) and an ionomer, the weight ratio between the ionomer and the nanoparticles of p-type semiconductor metal oxide(s) being between 0.005 and 0.115, and preferably between 0.01 and 0.055.

According to one particular embodiment, the layer according to the invention consists of at least some nanoparticles of p-type semiconductor metal oxide(s) selected from $V_2O_5$, NiO, $MoO_3$, $WO_3$ and mixtures thereof and of at least one ionomer which is a perfluorosulfonated copolymer, the weight ratio between the ionomer and the nanoparticles of p-type semiconductor metal oxide(s) selected from $V_2O_5$, NiO, $MoO_3$, $WO_3$ and mixtures thereof being between 0.005 and 0.115.

Generally, the p-layer may be formed by depositing the layer of ink at the surface of the substrate considered by any wet process such as solution coating, dipping, inkjet printing, spin coating, dip coating, roll coating, spray coating. The deposition will be carried out by spin coating, by tape casting, for example doctor blading, dipping, by spin coating, by slot die, by inkjet, by photogravure or else by screen printing.

The thickness of the layer may be controlled during the deposition. Specifically, since the constituents of the expected p-layer are dissolved in a liquid, the fluid layer may be spread over the support as a thin film.

After the deposition, a drying step is advantageously carried out.

The solvent(s) of the ink may be easily evaporated during this drying step.

This step is especially carried out at a temperature ranging from 80° C. to 140° C. for a period ranging from 1 minute to 30 minutes.

It is of course possible to carry out the formation of the p-layer via the superposition of several layers of ink according to the invention.

In general, the thickness of the p-layer according to the invention, again represented by the gap that exists between the layers that flank said p-layer, varies from 0.01 microns to around 50 microns.

Preferably, the thickness of the p-layer is less than 20 microns, preferably less than 5 microns, and advantageously less than 1 micron.

More preferably still, the thickness of the p-layer is between 0.05 microns and 0.1 micron.

The invention also relates to a process for forming a p-type layer in an organic electronic device, comprising the following steps:
  providing a support;
  providing an ink according to the invention;
  carrying out the deposition of a layer of ink at the surface of said support; and, where appropriate, the drying of this layer in order to form the p-layer.

Depending on the architecture of the cell that it is desired to obtain: standard or inverted structure, the support is respectively an electrode of anode type or an active layer.

The deposition of the ink on the support may be carried out by any appropriate wet process.

The deposit of ink is then dried or left to dry.

The present invention also targets an organic electronic device, characterized in that it comprises a p-type layer as defined above.

An organic electronic device according to the invention has a standard structure or an inverted structure.

As mentioned above, it may be an organic photovoltaic cell, an organic light-emitting diode (OLED) or an organic photodetector (OPD).

The invention also targets a process for forming an organic electronic device, characterized in that it comprises a step of depositing a layer of ink as defined above under conditions conducive to the formation of a p-type layer.

According to a first variant, the present invention relates to a process for forming an organic electronic device in inverted structure comprising the following steps:
  providing a stack composed of the following layers in this order: substrate, cathode, n-type layer, active layer;
  depositing, on said active layer, a layer of ink according to the invention under conditions conducive to the formation of a p-type layer.

An anode, and preferably a silver electrode, is then superposed on this p-type layer.

According to a second variant, the present invention relates to a process for forming an organic electronic device in standard structure comprising the following steps:
  providing a substrate coated with an electrode (anode),
  depositing, on said anode, a layer of ink according to the invention under conditions conducive to the formation of a p-type layer.

Generally, the following layers are then superposed successively on this p-type layer: an active layer, an n-type layer, a cathode.

EXAMPLES

Example 1

Formulation of an Ink

An ink is prepared from a commercial dispersion of $WO_3$ nanoparticles (2.5% by weight, without surfactant, 2-propanol base, particle size 10-20 nm, crystalline structure: triclinic) distributed by Nanograde Llc and from a commercial formulation of Nafion® (solution of Nafion® 117 having ~5% solids, sold by Sigma-Aldrich).

The ink thus formed comprises 96.5% by weight of isopropanol, 1% by weight of n-propanol, 2.45% by weight of $WO_3$ and 0.1% by weight of Nafion®.

Example 2

Use of the Ink According to Example 1 for Forming a P-Layer

The organic electronic device considered is a device of NIP (inverted) type having the following structure:

| |
|---|
| Silver |
| P-layer |
| Active layer |
| N-layer |
| Conductive oxide |
| PET substrate |

Its n-layer is a zinc oxide (ZnO) layer and its active layer is a polymer/methyl [6,6]-phenyl-$C_{61}$-butyrate (PCBM) layer.

The ink from example 1 dedicated to forming the p-layer, at the surface of the active layer of the stack, is applied by spin coating and dried, at a temperature of 120° C. for 2 minutes. The p-layer thus formed contains 4% by weight of Nafion® and 96% by weight of $WO_3$.

The silver electrode is then formed at the surface thereof. The active surface area of the devices is 0.28 $cm^2$.

In the same manner, a device of NIP (inverted) type having the same structure, but being a control, is formed with a p-layer comprising only $WO_3$. The ink used to form this p-layer comprises 97.5% by weight of isopropanol, and 2.5% by weight of $WO_3$. The corresponding p-layer then contains 100% by weight of $WO_3$.

Example 3

Performances and Stability of the Devices

The performance of the devices of NIP (inverted) type from example 2 are measured at 25° C. in an inert atmosphere under standard illumination conditions (1000 W/$m^2$, AM 1.5G).

The parameters tested are the following:
Voc: open circuit voltage;
Jsc: short-circuit current density;
FF: fill factor;
PCE: power conversion efficiency.

These parameters are tested according to the protocols described in Perrier et al., Solar Energy Materials and Solar Cells, June 2012, Vol. 101, Pages 210-216.

Table 1 below summarizes the performances of the device provided with a p-layer according to the invention. Table 2 summarizes the performances of the control device.

Performance 1: initial performance of the device considered;
Performance 2: performance of the device considered after an exposure to air for 2 hours, in the absence of light; and
Performance 3: performance of the device considered after a heat treatment for 2 minutes at 150° C. in a glove box.

TABLE 1

(Device according to the invention)

| P-layer | $V_{oc}$ (mV) | Jsc (mA·cm$^2$) | FF (%) | PCE (%) | $\Delta t_0$ |
|---|---|---|---|---|---|
| Performance 1 | 751.6 | 12.6 | 48.8 | 4.6 | / |
| Performance 2 | 763.0 | 12.9 | 48.2 | 4.7 | +2% |
| Performance 3 | 764.3 | 14.3 | 48.7 | 5.3 | +15% |

TABLE 2

(Control device)

| P-layer | $V_{oc}$ (mV) | Jsc (mA·cm$^2$) | FF (%) | PCE (%) | $\Delta t_0$ |
|---|---|---|---|---|---|
| Performance 1 | 715.2 | 13.5 | 55.4 | 5.3 | / |
| Performance 2 | 672.1 | 11.4 | 35.4 | 2.7 | −50% |
| Performance 3 | 382.6 | 5.2 | 20.2 | 0.4 | −90% |

For a device provided with a p-layer according to the invention, the beneficial effect of the Nafion® is clearly apparent after an exposure to air for 2 hours, in the absence of light, since the efficiency of the cells does not decrease.

Similarly, an increase in the efficiency is noted after a heat treatment for 2 minutes at 150° C. in a glove box, demonstrating that the initial performance is optimized. The beneficial effect of the Nafion® is therefore verified.

Conversely, as regards the control device, it is clearly distinguished that the efficiency of the cells decreases significantly, in the absence of light, after an exposure to air for 2 hours.

In addition, after a heat treatment for 2 minutes at 150° C. in a glove box, the performance thereof is virtually zero.

Example 4

Concentration Range of Nafion® in Combination with $WO_3$

Moreover, the initial performances of the devices are evaluated as function of the Nafion®/$WO_3$ weight ratio within the dry layer.

The test parameters are identical to those from example 3. The results are listed in table 3 below.

TABLE 3

| Nafion®/$WO_3$ weight ratio in the dry layer | Voc (mV) | Jsc (mA·cm$^{-2}$) | FF (%) | PCE (%) |
|---|---|---|---|---|
| 1 | 751 | 5.3 | 20.9 | 0.8 |
| 0.25 | 725 | 8.0 | 29.7 | 1.7 |
| 0.111 | 754 | 11.6 | 55.1 | 4.8 |
| 0.053 | 733 | 12.6 | 54.8 | 5.0 |
| 0.042 | 754 | 12.6 | 52.8 | 5.0 |
| 0.02 | 716 | 12.9 | 58.3 | 5.4 |
| 0.01 | 720 | 13.2 | 58.6 | 5.6 |

When the Nafion®/$WO_3$ weight ratio is between 0.01 and 0.111, the performances of the devices are very good.

On the contrary, when the Nafion®/$WO_3$ weight ratio within the dry layer is equal to 0.25 or 1, the performances of the devices are poor.

The invention claimed is:

1. An ink, suitable for forming a p-type layer in an organic photovoltaic cell having a standard structure or an inverted structure, comprising at least nanoparticles of p-type semiconductor metal oxide(s) formed completely of $WO_3$ or a mixture of $WO_3$ with nanoparticles of p-type semiconductor metal oxide(s) selected from $V_2O_5$, NiO and/or $MoO_3$ and an ionomer, said ionomer being a perfluorosulfonated copolymer, the weight ratio between the ionomer and the nanoparticles of p-type semiconductor metal oxide(s) formed completely of $WO_3$ or a mixture of $WO_3$ with nanoparticles of p-type semiconductor metal oxide(s) selected from $V_2O_5$, NiO and/or $MoO_3$ being between 0.005 and 0.115.

2. The ink as claimed in claim 1, wherein the weight ratio between the ionomer and the nanoparticles of p-type semiconductor metal oxide(s) is between 0.01 and 0.055.

3. The ink as claimed in claim 1, wherein the ionomer is a sulfonated tetrafluoroethylene copolymer.

4. The ink as claimed in claim 1, consisting of an organic solvent, of at least nanoparticles of p-type semiconductor metal oxide(s) formed completely of $WO_3$ or a mixture of $WO_3$ with nanoparticles of p-type semiconductor metal oxide(s) selected from $V_2O_5$, NiO and/or $MoO_3$ and of at least one ionomer which is a perfluorosulfonated copolymer, the weight ratio between the ionomer and the nanoparticles of p-type semiconductor metal oxide(s) formed completely of $WO_3$ or a mixture of $WO_3$ with nanoparticles of p-type semiconductor metal oxide(s) selected from $V_2O_5$, NiO and/or $MoO_3$ being between 0.005 and 0.115.

5. A process for forming an organic photovoltaic cell having a standard structure or an inverted structure, comprising a step of depositing a layer of ink as defined in claim 1 under conditions conducive to the formation of a p-type layer.

6. The ink as claimed in claim 1, wherein the ionomer is a copolymer having a tetrafluoroethylene backbone comprising perfluorovinyl ether groups and the terminal ends of which are functionalized by sulfonate groups or sulfonic acid functions.

7. The ink as claimed in claim 1, additionally comprising an alcoholic solvent.

8. The ink as claimed in claim 7, herein the alcoholic solvent is a $C_2$-$C_4$ lower monoalcohol.

9. A p-type layer of an organic photovoltaic cell having a standard structure or an inverted structure, comprising at least nanoparticles of p-type semiconductor metal oxide(s) formed completely of $WO_3$ or a mixture of $WO_3$ with nanoparticles of p-type semiconductor metal oxide(s) selected from $V_2O_5$, NiO and/or $MoO_3$ and an ionomer, said ionomer being a perfluorosulfonated copolymer, the weight ratio between the ionomer and the nanoparticles of p-type semiconductor metal oxide(s) formed completely of $WO_3$ or a mixture of $WO_3$ with nanoparticles of p-type semiconductor metal oxide(s) selected from $V_2O_5$, NiO and/or $MoO_3$ being between 0.005 and 0.115.

10. The layer as claimed in claim 9, wherein the ionomer is a sulfonated tetrafluoroethylene copolymer.

11. The layer as claimed in claim 9, consisting of at least nanoparticles of p-type semiconductor metal oxide(s) formed completely of $WO_3$ or a mixture of $WO_3$ with nanoparticles of p-type semiconductor metal oxide(s) selected from $V_2O_5$, NiO and/or $MoO_3$ and of at least one ionomer which is a perfluorosulfonated copolymer, the weight ratio between the ionomer and the nanoparticles of p-type semiconductor metal oxide(s) formed completely of $WO_3$ or a mixture of $WO_3$ with nanoparticles of p-type semiconductor metal oxide(s) selected from $V_2O_5$, NiO and/or $MoO_3$ being between 0.005 and 0.115.

12. An organic photovoltaic cell having a standard structure or an inverted structure, comprising a p-type layer as defined in claim 9.

13. The layer as claimed in claim 9, wherein the weight ratio between the ionomer and the nanoparticles of p-type semiconductor metal oxide(s) is between 0.01 and 0.055.

14. The layer as claimed in claim 9, wherein the ionomer is a copolymer having a tetrafluoroethylene backbone comprising perfluorovinyl ether groups and the terminal ends of which are functionalized by sulfonate groups or sulfonic acid functions.

15. A process for forming a p-type layer in an organic photovoltaic cell having a standard structure or an inverted structure, comprising at least the step of using $WO_3$ nanoparticles, said nanoparticles being formulated with at least one ionomer in said p-type layer, said ionomer being a perfluorosulfonated copolymer, in an ionomer/$WO_3$ nanoparticles weight ratio of between 0.005 and 0.115.

\* \* \* \* \*